United States Patent [19]
Numasawa et al.

[11] Patent Number: 6,016,765
[45] Date of Patent: *Jan. 25, 2000

[54] PLASMA PROCESSING APPARATUS

[75] Inventors: Yoichiro Numasawa; Shinya Hasegawa, both of Tokyo; Tsutomu Tsukada, Chiba-ken; Nobuyuki Takahashi, Kanagawa-ken, all of Japan

[73] Assignee: Anelva Corporation, Fuchu, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/905,767

[22] Filed: Aug. 4, 1997

[30] Foreign Application Priority Data

Sep. 20, 1996 [JP] Japan ................ 8-271387

[51] Int. Cl.⁷ .................................... C23C 16/00
[52] U.S. Cl. ................... 118/723 I; 118/723 IR; 118/723 AN; 156/345
[58] Field of Search ............ 118/723 I, 723 IR, 118/723 AN; 156/345; 315/111.51

[56] References Cited

U.S. PATENT DOCUMENTS

| | | |
|---|---|---|
| 5,268,200 | 12/1993 | Steger . |
| 5,614,055 | 3/1997 | Fairbairn et al. .............. 156/345 |
| 5,647,913 | 7/1997 | Blalorn ............................. 118/723 I |
| 5,683,548 | 11/1997 | Hartiz et al. .................. 156/643.1 |
| 5,716,451 | 2/1998 | Hama et al. ..................... 118/723 |
| 5,763,851 | 6/1998 | Forster et al. ............... 219/121.43 |
| 5,792,272 | 8/1998 | van Os et al. .............. 118/723 IR |
| 5,800,621 | 9/1998 | Redener et al. ............. 118/723 AN |

FOREIGN PATENT DOCUMENTS 63-138737  6/1988  Japan .

Primary Examiner—R. Bruce Breneman
Assistant Examiner—Luz Alejandro
Attorney, Agent, or Firm—Burns, Doane, Swecker & Mathis, LLP

[57] ABSTRACT

A plasma processing apparatus is furnished with a reactor which is furnished with a susceptor 12, a reaction gas delivery mechanism which delivers reaction gas to the inside of the reactor, a pumping mechanism 24 which pumps out an interior of the reactor, and a plasma-generating mechanism. The reactor is made of metal, the plasma-generating mechanism includes an at least single-winding coil 16 which produces an induced electric field, and the coil is established within the reactor and surrounding the plasma-generating space in a state surrounded by dielectrics parts 15 and 17.

21 Claims, 1 Drawing Sheet

PLASMA PROCESSING APPARATUS

BACKGROUND OF THE INVENTION

1. Field of the Invention

The invention concerns plasma processing apparatus and, more precisely, it concerns chemical vapor deposition apparatus (CVD apparatus) with which dielectric films are deposited on substrates using plasma in the manufacturing process of semiconductor devices.

2. Description of Related Art

Plasma-enhanced chemical vapor deposition apparatus (PECVD apparatus), with which dielectric films are deposited with plasma assist, are used in the semiconductor device manufacturing process. Diode parallel plate PECVD is often used for the CVD apparatus. High density plasma (HDP) is required for dielectric film gap-fill for a design rule of $\leq 0.25$ $\mu$m in ultra-large integrated circuits with apparatus of this type.

Conventional HDP-PECVD apparatus with which dielectric films are deposited has been disclosed, for example, in Japanese Unexamined Patent Publication H8-92748 and Japanese Unexamined Patent Publication H8-213196. All of the literature discloses inductively coupled plasma (ICP) sources in which a coil is used. HDP-PECVD apparatus in which an ICP source is used must have at least the side wall of the reactor made of a dielectric material such as quartz glass since the induced electric field is introduced into the plasma generating space from a coil which is wound externally on the reactor.

Conventional HDP-PECVD apparatus have a dielectric material as the side wall of the reactor, as mentioned above, and so the two problems indicated below arise. The first problem is that the side wall of the reactor deteriorates because plasma cleaning is carried out repeatedly. The second problem is that it is difficult to establish a shower-type reaction gas delivery inlet port or a plurality of inlet ports in the upper part of the reactor from a safety viewpoint. A nozzle-type reaction gas delivery inlet port or a single inlet port is used in the aforementioned patent specifications.

These problems become more pronounced when the reactor must be increased in size in line with the diameter of the substrate which is to be processed.

OBJECTS AND SUMMARY

A purpose of this invention is to resolve the above-mentioned problems and provide high density plasma processing apparatus which is furnished with an inductively coupled plasma (ICP) source in such a way that deterioration of the reactor side wall is prevented, reactor safety is raised, and reaction gas can be delivered in a shower-like form from the upper part of the reactor.

A plasma processing apparatus according to the present invention has a plasma-generating coil enclosed in an assembly of dielectric parts established within a reactor which is made of metal.

Moreover, the plasma processing apparatus has a substrate-holding mechanism, a reaction gas supply mechanism which supplies reaction gas into the reactor, and a pumping mechanism which pumps out the interior of the reactor.

In this invention, the coil for generating the plasma can be arranged within the reactor and so metal can be used for the reactor material. This enables the strength and durability of the reactor to be increased. Hence the safety of the reactor is improved. The coil which is arranged within the reactor may be covered with dielectric and protected from the plasma.

The dielectric which surrounds the coil preferably includes a dielectric supporting part, which supports the coil, and a tubular dielectric wall. The tubular dielectric wall may be arranged so as to surround the plasma-generating space within the reactor. The dielectric supporting part may be arranged in such a way that it is in contact with the side wall of the reactor. With such an assembly, just the tubular dielectric wall which is exposed to the plasma can be replaced, as required, and this is desirable from the viewpoint of simple maintenance.

The upper wall of the reactor is preferably connected in such a way that it can be opened and closed freely with a rotating support part on the side wall. Sealing material, such as an O-ring for example, may be established on the edge of the side wall so that the upper wall and the side wall edge are in air-tight contact via the O-ring when the upper wall is closed. Maintenance when replacing the tubular dielectric wall, for example, can be accomplished easily as a result of the fact that the upper wall can be opened and closed freely with respect to the side wall of the reactor.

The reaction gas supply mechanism preferably has a shower-type reaction gas delivery inlet port which is established in the upper wall. The reaction gas is introduced into the plasma-generating space through the shower-type reaction gas delivery inlet port.

The plasma processing apparatus of the present invention preferably has a gas delivery inlet port which delivers inert gas to the dielectric material members which are assembled so as to surround the coil formed in the upper wall of the reactor. The inert gas flows in the gaps between the members, protects the O-ring from corrosion, and prevents the build-up of unwanted film in the gaps between the members.

The plasma processing apparatus of the present invention preferably includes a first mechanism which supplies high frequency power to the coil and a second mechanism which supplies high frequency power to the substrate holding mechanism.

The plasma processing apparatus of the present invention is a dielectric film PECVD apparatus for building up a dielectric film on the surface of a substrate which has been located on the substrate-holding mechanism. This PECVD apparatus can also be used for the deposition of a metallic film. Moreover, the plasma processing apparatus of the present invention can also be used as an apparatus for carrying out plasma processes such as etching and film modification. The reactor in the HDP-PECVD apparatus which is furnished with an ICP source can again be made out of metal in this case. Hence, deterioration of the side wall of the reactor can be prevented and reactor safety can be increased. A shower-type gas delivery inlet port can be established in the upper part of the reactor.

DETAILED DESCRIPTION OF THE PREFERRED EMBODIMENT

Figure 1:
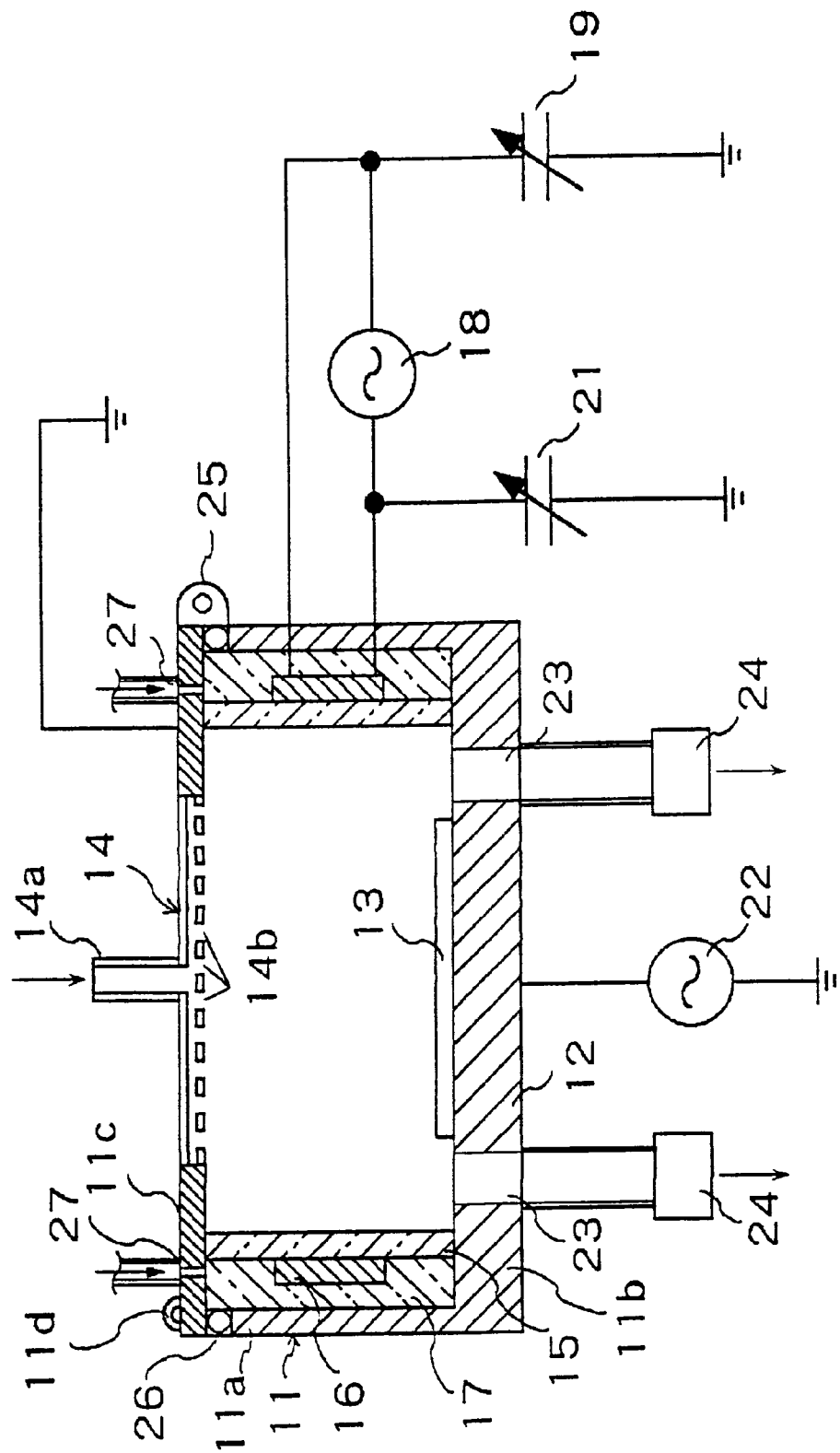
FIG. 1 is a vertical cross-sectional view which shows the outline construction of a dielectric film PECVD apparatus according to the present invention.

A dielectric film PECVD apparatus is described in this preferred embodiment, but the fundamental structure is the same in plasma processing apparatus for etching or film modification purposes.

The PECVD apparatus shown in FIG. 1 is furnished with a reactor 11. The reactor 11 is made of metal. The reactor 11 comprises a cylindrical side wall 11a and a bottom wall 11b. The susceptor 12 is located in the center of the bottom wall 11b and the substrate 13 is located on top of the susceptor 12. The upper wall 11c of the reactor 11 opens and closes freely. A shower-type reaction gas delivery inlet port 14 is established roughly in the center of the upper wall 11c.

A tubular insulator (preferably dielectric) 15 is arranged within the reactor 11. An inside region and an outside region are formed within the reactor 11 with the tubular insulator 15 as a boundary. Reaction gas is delivered into the inside region and an induced electric field is produced to generate plasma. The inside region is the space in which plasma is generated.

A coil 16 with at least one winding is established in the outside region around the tubular insulator 15 for producing the induced electric field. The induced electric field is produced within the inside region, by the coil 16, through the tubular insulator 15. The coil 16 is supported by a supporting part 17 which is arranged in the outside region. The coil supporting part 17 is made with an insulator (preferably a dielectric) and is of cylindrical shape as a whole, with a groove on the inside surface to accommodate the coil 16. With such an assembly, the coil 16 is surrounded by the coil supporting part 17 and the tubular insulator 15. The coil 16 is arranged within the reactor 11.

The coil 16 for producing the induced electric field is connected to a radio frequency power supply mechanism 18. The radio frequency power supply mechanism 18 is the power supply which provides the power for plasma generation. The variable condensers 19 and 21 are connected to the radio frequency power supply mechanism 18 for matching the power input to the plasma.

The upper wall 11c of the reactor 11 is made of metal and, moreover the upper wall 11c is grounded. Consequently, the reactor 11 is maintained at ground potential. Furthermore, a radio frequency power supply mechanism 22 is connected to the susceptor 12 for applying a bias voltage to the substrate 13.

The reaction gas is delivered to the inside region of the reactor 11 from the shower-type reaction gas delivery inlet port 14. The reaction gas which has been delivered into the inside region is pumped out from an exhaust port 23 by means of a pumping mechanism 24. The pumping mechanism 24 may comprise a combination of a dry pump and a turbo-molecular pump.

The upper wall 11c of the reactor 11 can be opened and closed freely. One part of the upper wall 11c is connected to the side wall 11a of the reactor 11 with a freely rotatable hinge 25. The upper wall 11c opens and closes freely about the hinge 25. A handle lid is established on the other edge of the upper wall 11c, and opening and closing are achieved manually by lifting at this point. An O-ring 26 is arranged on the upper edge of the side wall 11a of the reactor 11. An air-tight seal is maintained between the upper wall 11c and the side wall 11a by the O-ring 26 when the upper wall 11c is closed.

The shower-type reaction gas delivery inlet port 14 blows reaction gas supplied from a pipe 14a of the reaction gas supply mechanism (not shown in the drawing) into the plasma-generating space from a plurality of small holes 14b.

The coil 16 is arranged within the reactor 11, surrounded by the tubula insulator 15 and the insulator coil supporting part 17, in the embodiment shown in FIG. 1. Because the reactor 11 itself can be made of metal, not dielectric, the strength of the reactor is raised, deterioration is prevented, and, moreover, safety is improved. Replacement of the tubular insulator 15 and the coil supporting part 17 can be achieved easily during maintenance since the coil 16 is surrounded by the tubular insulator 15 and the coil supporting part 17. Moreover, the upper wall 11c is constructed to open and close freely to facilitate maintenance of the reactor 11. Sealing of the reactor 11 can be improved by the arrangement of the O-ring 26 between the upper wall 11c and the side wall 11a.

An inert gas delivery inlet port 27 may be formed in the upper wall 11c. An inert gas such as argon is introduced from the inert gas delivery inlet port 27 and purges reaction gas from between the parts within the reactor 11. The O-ring 26 is protected against corrosion which might otherwise result from exposure to reaction gas between the members. The inert gas flows in such a way as to prevent attachment of reaction gas molecules to the O-ring 26. The inert gas flows in small gaps which are formed between the side wall 11a, the upper wall 11c, the coil 16 for producing the induced electric field, the coil supporting part 17 and the tubular insulator 15. The flow of inert gas prevents the build-up of unwanted films in the gaps between these members. As a result, the inert gas flow is concerned with control of dust particle generation.

The coil 16 for producing the induced electric field can have any form, such as a cylindrical single winding (or simple winding) coil, a disk-shaped single winding coil or a complex winding coil.

An exemplary embodiment, in which dielectric film PECVD apparatus is used to deposit a silicon oxide film, is described below. In this embodiment, a silicon (Si) wafer of diameter 200 mm is used for the substrate 13, and a silicon oxide film is built-up on this substrate. An electrostatic chuck susceptor of diameter 200 mm is used for the susceptor 12 and a cylindrical single-winding coil of diameter 280 mm is used as the induced electric field-producing coil 16. Power (13.56 MHz, 2.5 kW) is supplied to the cylindrical single-winding coil from the plasma-generating radio frequency power supply mechanism 18. Moreover, power (13.56 MHz, 2.0 kW) is supplied to the susceptor 12 from the substrate bias voltage radio frequency power supply mechanism 22. SiH4 gas from the shower-type reaction gas delivery inlet port 14, and Ar gas, are supplied at flow rates of 100 sccm and 500 sccm, respectively.

A silicon oxide film can thus be grown under these conditions on an Si wafer on which metallic wiring of width 0.2 $\mu$m has been formed. It has been confirmed that it is possible to realize filling growth with a silicon oxide film in the gaps between the metallic wiring with a high uniformity of film thickness of ±2%. Continuous growth was carried out on 100,000 wafers. It was confirmed that there was no deterioration of the reactor 11 in the PECVD apparatus in this embodiment. It was also confirmed that film deposition for gap-fill could be realized with good reproducibility and with high productivity by just replacing the tubular insulator 15 after each 5000 substrates as maintenance.

An example of the filling growth of an insulating film such as a silicon oxide film has been described, but the PECVD apparatus of this embodiment can also be used for metallic films. Moreover, the characteristic structure of this invention can also be used in apparatus for plasma processing such as etching and film modification.

It is possible to make the reactor itself out of metal with the plasma processing apparatus of the present invention and so deterioration of the reactor is prevented, the reactor strength is raised, and reactor safety is also raised. It is also possible to increase the size of the reactor to correspond with larger sizes of semiconductor substrates since the strength of the reactor has been raised.

A shower-type reaction gas delivery inlet port can be used for the reactor reaction gas delivery inlet port since reactor safety has been raised. Furthermore, reactor maintenance is simple because the upper wall of the reactor is constructed to open and close.

The basic structure of this PECVD apparatus can also be used for etching and film modification. If used in plasma processing apparatus for etching and film modification etc., it can be used not only with dielectric films but also with metal films, and the same effects as described earlier can be realized except for the effects concerned with deposition.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A plasma processing apparatus, comprising:
    a reactor made of metal including a side wall and a plasma-generating space within the reactor;
    a plasma generating coil;
    an assembly of dielectric parts surrounding the plasma generating coil, the plasma generating coil and the assembly of dielectric arranged within the side wall of the metal reactor so as to cover the side wall and protect the side wall from plasma in the plasma-generating space; and
    an inert gas delivery inlet port means for delivering an inert gas to the assembly of dielectric parts to purge a reaction gas from between the dielectric parts.

2. The plasma processing apparatus as claimed in claim 1, wherein the dielectric parts assembly which surrounds the plasma generating coil comprises a dielectric supporting part which supports the plasma generating coil and a tubular dielectric wall, the tubular dielectric wall is arranged in such a way as to define the plasma-generating space within the reactor and the dielectric supporting part is in contact with the side wall of the reactor.

3. The plasma processing apparatus as claimed in claim 1, wherein the reactor includes an upper wall that is connected to open and close freely with a rotating support means on the side wall of the reactor, and a sealing material is established on an edge of the side wall.

4. The plasma processing apparatus as claimed in claim 3, wherein the inert gas delivery inlet port means is formed in the upper wall of the reactor and is in fluid communication with the sealing material to prevent corrosion of the sealing material.

5. The plasma processing apparatus as claimed in claim 1, further comprising a reaction gas supply means which has a shower-type reaction gas delivery inlet device and which is provided in an upper wall of the reactor.

6. The plasma processing apparatus as claimed in claim 1, further comprising first means for supplying high frequency power to the plasma generating coil and second means for supplying high frequency power to a substrate-holding mechanism.

7. The plasma processing apparatus as claimed in claim 1, wherein the plasma processing apparatus is an insulating film plasma-enhanced CVD apparatus including means for building up an insulating film on a surface of a substrate which has been located on a substrate holding mechanism.

8. The plasma processing apparatus as claimed in claim 1, wherein the assembly of dielectric parts completely surrounds the plasma generating coil.

9. The plasma processing apparatus as claimed in claim 1, wherein the plasma generating coil is sandwiched between a tubular insulator and a coil supporting part having an annular groove formed therein, the plasma generating coil being arranged in the groove, and wherein the tubular insulator and the coil supporting part comprise the assembly of dielectric parts.

10. The plasma processing apparatus as claimed in claim 1, wherein the inert gas delivery inlet port means is formed in an upper wall of the reactor.

11. The plasma processing apparatus as claimed in claim 10, wherein the inert gas delivery inlet port means is in fluid communication with the assembly of dielectric parts surrounding the plasma generating coil and the delivery inlet port means delivers the inert gas to prevent a build-up of unwanted films in gaps formed between parts of the assembly of dielectric parts.

12. A plasma processing apparatus, comprising:
    a reactor made of metal;
    a plasma generating coil;
    an assembly of dielectric parts surrounding the plasma generating coil, the plasma generating coil and the assembly of dielectric parts within the metal reactor;
    wherein the dielectric parts assembly which surrounds the plasma generating coil comprises a dielectric supporting part which supports the plasma generating coil and a tubular dielectric wall, the tubular dielectric wall is arranged in such a way as to define a plasma-generating space within the reactor and the dielectric supporting part is in contact with a side wall of the reactor; and
    an inert gas delivery inlet port means for delivering an inert gas to the assembly of dielectric parts to purge a reaction gas from between the dielectric parts.

13. The plasma processing apparatus as claimed in claim 12, wherein the reactor includes an upper wall the is connected to open and close freely with a rotating support means on the side wall of the reactor, and a sealing material is established on an edge of the side wall.

14. The plasma processing apparatus as claimed in claim 13, wherein the inert gas delivery inlet port means is formed in the upper wall of the reactor and is in fluid communication with the sealing material to prevent corrosion of the sealing material.

15. The plasma processing apparatus as claimed in claim 12, further comprising a reaction gas supply means which has a shower-type reaction gas delivery inlet device and which is provided in an upper wall of the reactor.

16. The plasma processing apparatus as claimed in claim 12, further comprising first means for supplying high frequency power to the plasma generating coil and second means for supplying high frequency power to a substrate-holding mechanism.

17. The plasma processing apparatus as claimed in claim 12, wherein the plasma processing apparatus is an insulating film plasma-enhanced CVD apparatus including means for building up an insulating film on a surface of a substrate which has been located on a substrate holding mechanism.

18. The plasma processing apparatus as claimed in claim 12, wherein the assembly of dielectric parts completely surrounds the plasma generating coil.

19. The plasma processing apparatus as claimed in claim 12, wherein the plasma generating coil is sandwiched between a tubular insulator and a coil supporting part having an annular groove formed therein, the plasma generating coil being arranged in the groove, and wherein the tubular insulator and the coil supporting part comprise the assembly of dielectric parts.

20. The plasma processing apparatus as claimed in claim 12, wherein the inert gas delivery inlet port means is formed in an upper wall of the reactor.

21. The plasma processing apparatus as claimed in claim 20, wherein the inert gas delivery inlet port means is in fluid communication with the assembly of dielectric parts surrounding the plasma generating coil and the delivery inlet port means delivers the inert gas to prevent a build-up of unwanted films in gaps formed between parts of the assembly of dielectric parts.

* * * * *